United States Patent
Nestler et al.

(10) Patent No.: US 11,475,269 B2
(45) Date of Patent: Oct. 18, 2022

(54) CONVOLUTIONAL NEURAL NETWORK

(71) Applicant: Analog Devices, Inc., Norwood, MA (US)

(72) Inventors: Eric G. Nestler, Long Beach Township, NJ (US); Mitra M. Osqui, Boston, MA (US); Jeffrey G. Bernstein, Middleton, MA (US)

(73) Assignee: Analog Devices, Inc., Wilmington, DE (US)

( * ) Notice: Subject to any disclaimer, the term of this patent is extended or adjusted under 35 U.S.C. 154(b) by 1419 days.

(21) Appl. No.: 15/379,114

(22) Filed: Dec. 14, 2016

(65) Prior Publication Data

US 2017/0169327 A1 Jun. 15, 2017

Related U.S. Application Data

(60) Provisional application No. 62/267,847, filed on Dec. 15, 2015.

(51) Int. Cl.
*G06N 3/04* (2006.01)
*G06N 3/063* (2006.01)
*H03M 1/80* (2006.01)

(52) U.S. Cl.
CPC ............. *G06N 3/04* (2013.01); *G06N 3/0454* (2013.01); *G06N 3/063* (2013.01); *G06N 3/0635* (2013.01); *H03M 1/802* (2013.01)

(58) Field of Classification Search
CPC ........ G06N 3/04; G06N 3/0454; G06N 3/063; G06N 3/0635; H03M 1/802
See application file for complete search history.

(56) References Cited

U.S. PATENT DOCUMENTS

| | | | | |
|---|---|---|---|---|
| 4,884,206 A | * | 11/1989 | Mate ...................... | F02P 5/152 701/111 |
| 5,343,555 A | * | 8/1994 | Yayla ................... | G06N 3/0675 706/35 |
| 5,485,416 A | * | 1/1996 | Ward ................... | G06N 3/0635 708/819 |
| 8,717,094 B2 | * | 5/2014 | Nestler ................... | H03K 5/00 327/551 |

(Continued)

FOREIGN PATENT DOCUMENTS

WO  1995/30962  11/1995

OTHER PUBLICATIONS

Korekado et al., "A VLSI Convolutional Neural Neural Network for Image Recognition Using Merged/Mixed Analog-Digital Architecture", 2004, Kyshu Institute of Technology, pp. 1-10 (Year: 2004).*

(Continued)

*Primary Examiner* — Li B. Zhen
*Assistant Examiner* — Henry Nguyen
(74) *Attorney, Agent, or Firm* — Akona IP PC

(57) ABSTRACT

Systems and methods of implementing a more efficient and less resource-intensive CNN are disclosed herein. In particular, applications of CNN in the analog domain using Sampled Analog Technology (SAT) methods are disclosed. Using a CNN design with SAT results in lower power usage and faster operation as compared to a CNN design with digital logic and memory. The lower power usage of a CNN design with SAT can allow for sensor devices that also detect features at very low power for isolated operation.

20 Claims, 9 Drawing Sheets

(56) References Cited

U.S. PATENT DOCUMENTS

| | | | |
|---|---|---|---|
| 2005/0151680 A1 | 7/2005 | Kearney | |
| 2011/0029471 A1* | 2/2011 | Chakradhar | G06N 3/063 706/25 |
| 2014/0355381 A1* | 12/2014 | Lal | B81B 3/0021 367/87 |
| 2015/0178246 A1 | 6/2015 | Herrero Abellanas et al. | |
| 2015/0306761 A1* | 10/2015 | O'Connor | G06N 3/008 700/250 |
| 2015/0309961 A1* | 10/2015 | Ozaki | G06F 17/10 706/16 |
| 2016/0285470 A1* | 9/2016 | Leuschner | H03M 1/66 |

OTHER PUBLICATIONS

Kub et al., "Programmable Analog Vector-Matrix Multipliers", 1990, IEEE, pp. 207-214. (Year: 1990).*

Hansen et al. "A Time-Multiplexed Switched-Capacitor Circuit For Neural Network Applications", IEEE, pp. 2177-2180. (Year: 1989).*

Pal, Srimanta. "A Generalized Neural Network for Edge Detection and Its Hardware Realization." Neural Parallel and Scientific Computatiions 15.4 (2007): 455. (Year: 2007).*

Lacy, Cameron. Design of a programmable switched-capacitor analog FIR filter. University of Toronto, 2001. (Year: 2001).*

International Search Report (ISR) and Written Opinion (WO) issued in PCT/US2016/066869 dated Mar. 27, 2017, 10 pages.

Alex Krizhevsky et al., *ImageNet Classification with Deep Convolutional Neural Networks*, Advances in Neural Information Processing Systems, 25, © 2012, 8 pages.

Yann LeCun et al., *Gradient-Based Learning Applied to Document Recognition*, Proc. of the IEEE, Nov. 1998, 46 pages.

Hansen et al., *A Time-Multiplexed Switched-Capacitor Circuit for Neural Network Applications*, CH2692-2/89/0000-2177 © 1989 IEEE, 4 pages.

* cited by examiner

CONVOLUTIONAL NEURAL NETWORK

CROSS-REFERENCE TO RELATED APPLICATION

This Application claims the benefit of priority under 35 U.S.C. § 120 of U.S. Application Ser. No. 62/267,847 filed Dec. 15, 2015, and entitled "Convolutional Neural Network" naming Eric Nestler et al. as inventors. The disclosure of the prior Application is considered part of and is incorporated by reference in the disclosure of this Application.

FIELD OF THE DISCLOSURE

The present invention relates to the field of neural networks, and in particular to convolutional neural networks.

BACKGROUND

Neural networks are mathematical models used to estimate approximate functions that can depend on a large number of inputs. Convolutional neural networks are a type of feed-forward neural network used for feature detection, in which the artificial neurons (mathematical functions) are tiled such that they respond to overlapping regions in the input field. Neural networks are computationally and resource intensive.

SUMMARY OF THE DISCLOSURE

A neural network using sampled analog technology is disclosed. Convolution Neural Networks (CNNs) are algorithms and circuits used for feature detection. In some implementations, detection or analysis of features can be for image data, audio data, or any other complex data that requires a sophisticated analysis to detect some feature of it. According to various implementations, CNNs can be helpful when the input data is in the form of an array with highly correlated local variables and have shift invariance. The CNN algorithm is typically implemented with digital logic and memory. However, implementing the CNN algorithm with digital logic and memory is resource intensive.

Systems and methods of implementing a more efficient and less resource-intensive CNN are disclosed herein. In particular, applications of CNN in the analog domain using Sampled Analog Technology (SAT) methods are disclosed. Using a CNN design with SAT results in much lower power usage and faster operation as compared to a CNN design with digital logic and memory. In one example, using a CNN design with SAT uses less than ten times the power that a typical digital CNN design uses. In one example, using a CNN design with SAT results in greater than ten times faster operation. One reason the operation of a CNN using SAT is faster is that an analog version can do in a single clock cycle an operation that takes many clock cycles in a digital version, due to the simultaneous nature of charge sharing. The lower power usage of a CNN design with SAT can allow for sensor devices that also detect features at very low power for isolated operation such as with IOT (Internet of Things) devices.

According to one implementation, a convolutional neural network using sampled analog technology includes an input source including first and second analog input data points, a first set of capacitors for analyzing the first analog input data point and outputting a first analog convolution output, and a second set of capacitors for analyzing the second analog input data point and outputting a second analog convolution output. The first and second analog convolution outputs each include a plurality of features.

In some implementations, a convolutional neural network further includes an array of variable capacitance structures, wherein the first and second convolution outputs are multiplexed through the array of variable capacitance structures to generate a multiplexed convolution output.

In some implementations, the first and second sets of capacitors include fixed capacitors, and the fixed capacitors are analog memory cells. In some implementations, the first and second sets of capacitors are variable capacitance cells with fixed weights. In some examples, the fixed weights are implemented using a memory capacitor size, and the memory capacitor size is equal to a weight of the fixed weights.

In some implementations, the first set of capacitors and the second set of capacitors are driven by the input source.

In various implementations, the convolution neural network further includes a first fixed voltage source having a charge, and a first capacitor digital-to-analog converter (capDAC). The charge from the first fixed voltage source is sampled by the first capDAC to generate a first bias value, and the first bias value is added to the first output.

In some implementations, the convolutional neural network further includes a sub-sampler coupled to the first and second analog convolution outputs, wherein the sub-sampler averages the first and second analog convolution outputs to generate a mean convolution output, and wherein the sub-sampler processes the mean convolution output with a nonlinear transfer function. In some examples, the nonlinear transfer function is an analog rectification function.

In some implementations, the convolutional neural network further includes a sub-sampler coupled to the first analog convolution output, wherein the first analog convolution output includes a subwindow of values, and wherein the sub-sampler includes a plurality of analog voltage comparators for determining a maximum value of the subwindow of values of the first analog convolution output.

According to some examples, the input source includes multiple analog input data points, and multiple sets of capacitors are used, with each set of capacitors analyzing a subwindow of the analog input data points.

According to one implementation, a method for implementing a neural network using sampled analog technology includes receiving analog input data including first and second analog input data points, analyzing the first analog input data point with a first set of capacitors to generate a first analog convolution output, and analyzing the second analog input data point with a second set of capacitors to generate a second analog convolution output, wherein generating the first and second analog convolution outputs includes performing an analog convolution operation on a plurality of features. According to one example, analyzing includes performing a convolution operation.

In some implementations, the method further includes multiplexing the first and second analog convolution outputs through an array of variable capacitance structures to generate an analog multiplexed convolution output.

In some implementations, the first and second sets of capacitors are variable capacitance cells, the first set of capacitors have a first fixed weight, and the second set of capacitors have a second fixed weight, and generating the first analog convolution output includes multiplying the first input data point with the first fixed weight, and generating the second analog convolution output includes multiplying the second input data point with the second fixed weight.

In some implementations, the method includes generating a first bias value by sampling, using a first capacitor digital-to-analog converter, a scaled charge from a first fixed voltage source, and adding the first bias value to the first output.

In some implementation, the method includes averaging the first analog convolution output with the second analog convolution output at a sub-sampler. In some implementations, the first analog convolution output includes a subwindow of values, and the method includes determining a maximum value of the subwindow of values.

According to one implementation, a convolutional neural network using sampled analog technology includes an input including analog input data, a plurality of sets of capacitors, each set of capacitors configured to analyze a respective subwindow of the analog input data and output an analog convolution output for the respective subwindow, wherein the analog convolution output includes a plurality of features, and an analog sub-sampler coupled to the analog convolution output. The analog sub-sampler is configured to reduce a size of at least one of the plurality of features of the analog convolution output.

In some implementations, the plurality of sets of capacitors output a respective plurality of analog convolution outputs, and a plurality of analog sub-samplers are coupled to the plurality of analog convolution outputs. The plurality of analog convolution outputs each includes a plurality of features, and each of the plurality of analog convolution outputs is based on a convolution of an output from a respective set of capacitors. Each of the plurality of analog sub-samplers is configured to reduce a size of at least one of the plurality of features of a respective analog convolution output.

In some implementations, the sets of capacitors comprise fixed capacitors, and the fixed capacitors are analog memory cells. In some implementations, the sets of capacitors comprises variable capacitance cells with fixed weights.

In one implementation, the convolution neural network includes a fixed voltage source having a charge, and a capacitor digital-to-analog converter (capDAC). A charge from the fixed voltage source is sampled by the capDAC to generate a bias value, and the bias value is added to an output from one of the plurality of sets of capacitors.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which.

DETAILED DESCRIPTION

Systems and methods are provided for reducing the power and latency for the calculation of convolutional neural networks (CNNs) using Sampled Analog Technology (SAT). CNNs are used for a variety of applications. For example, CNNs are used for character recognition. CNNs are a very powerful way of detecting patterns or features in complex data.

Sampled Analog Technology signal processing is performed in the analog domain by charge sharing among capacitors using only electronic switches and capacitor elements. A sampled analog filter filters incoming analog signals without first digitizing the signals. Sampled analog technology uses discrete time filter architectures combined with analog signal processing, which eliminates any data path quantization noise issues and analog-to-digital and digital-to-analog conversion steps.

Convolutional Neural Networks

Figure 1:
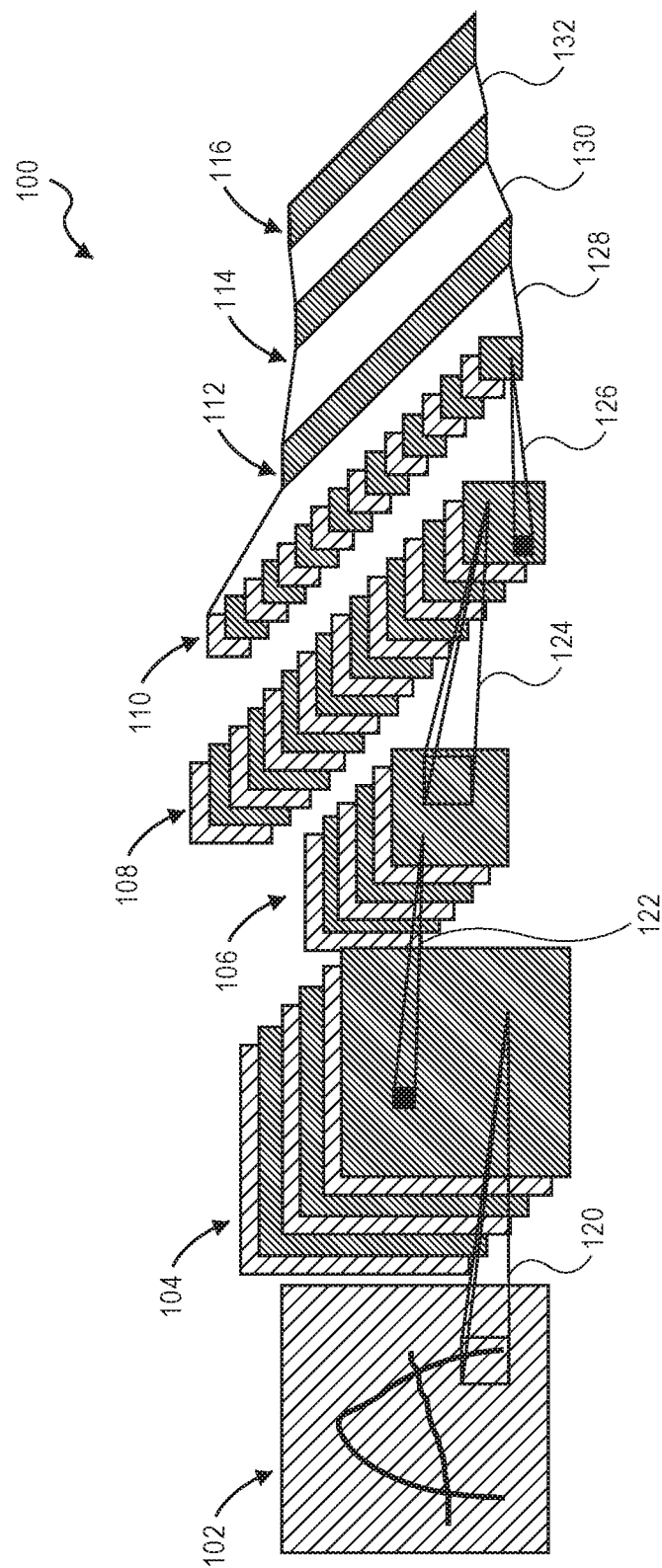
FIG. 1 is a diagram illustrating a convolutional neural network.

There are many different forms of CNN structures. FIG. 1 shows a block diagram for a deep neural network structure with seven layers. The layers include convolution layers alternating with subsampling layers. Each layer is computationally intensive.

Each layer in the CNN shown in FIG. 1 includes a convolution of an N×N sub-window of the input image pixel data 102. In the first layer 104 of FIG. 1, the sub-window is 5×5 pixels with a stride of one. Thus, each sub-window is shifted one pixel from the last sub-window as the image data is scanned and convolved 120. The sub-window can be overlapping or non-overlapping by choice of N and the stride value.

The second operation 122 in the second layer 106 is a subsampling operation. It is a 2×2 subwindow weighted mean followed by a nonlinear function, or squashing function, to generate the output data of each subwindow. The subsampling result is a 14×14 array of processed pixel data when the subsampling uses a 2×2 window. The resulting subsampled data 106 is then processed by a convolution operation 124 resulting in a third layer 108, which is a convolution layer. The data from the third layer 108 is subsampled 126 resulting in a fourth layer 110, which is a subsampling layer. As shown in FIG. 1, there can be many layer pairs alternating between a convolution layer and a subsampling layer. In FIG. 1, a full connection operation 128 on the fourth layer 110 results in a fifth layer 112, which is a convolution layer. In one example, the fourth layer 110 is fully connected to the fifth layer 112 such that every output of the fourth layer 110 is connected to every input of the fifth layer 112. Each output of the fourth layer 110 can be connected to an input of the fifth layer via individual weights and non-linear functions. Note that the individual weights are learned weights. Similarly, a full connection operation on the fifth layer 112 results in the sixth layer 114. A Gaussian connection operation is performed on the sixth layer 114 to yield the seventh layer 116, which is the output.

In other implementations, the second operation begins with the nonlinear function followed by a subwindow weighted mean. In other implementations, the nonlinear function is part of the convolution layer, such that the output of the convolution layer is non-linear. Convolution and subsampling layers are described in greater detail below.

Convolutional Layer

According to one implementation, each convolution step takes a subwindow of the image data and weights each input to the convolution by a trainable and independent weight. In one example, there are 25 programmable weights used in each sum. The same weights are used for every subwindow scan of the image data for each feature. Additionally, there is a trainable bias weight added to the convolution sums.

A feature is an individual measurable property of the input data. For example, features may include edge detectors and color blob detectors. In other examples, features focus on finer details specific to the input data set and labels. In various applications, features can be numeric or structural. The neural network learns the features from the input data, and each layer of the neural network extracts some features from the input data. In some implementations, additional information is provided to the neural network in the form of derived features from the data.

In FIG. 1, the convolution output from the first convolution operation 120 is shown as six features in the first layer 104. The number of features is application dependent. Each feature is an independent set of programmable weights for convolutional scans of the image data. The same weights are used for all convolution sums of the data of a particular feature and each feature is associated with a unique set of weights.

Each convolution of each feature is implemented as a sum of products, as shown in Equation 1.1 below. In the example of FIG. 1, using a 5×5 subwindow, N=25:

$$y[n] = \sum_{i=0}^{N} w_i x[n-i] + b_n \qquad \text{(Eq. 1)}$$

The weights, $w_j$ and $b_n$ are programmable and represent the learned behavior. Using SAT, the entire convolution using programmable weights and bias can be implemented passively.

In this application, the multiple convolutions can be implemented in various ways. Image data is updated at a particular frame rate (frames per second (fps)). To operate in real time, the convolutions of all features of a single layer are completed before the next image data update (1/fps seconds). Two exemplary methods for implementing the convolutions in real time using SAT are described below. Other methods for implementing CNNs using SAT include combinations of the methods specifically described herein.

According to various implementations, the data can be in many forms. For example, in one implementation, CNN is used for DNA mapping.

Sub-Sampling Layer

The input to a CNN goes through multiple layers. In some implementations, such as illustrated in FIG. 1, the input alternates between convolution layers (e.g., first 104, third 106, and fifth 112 layers) and sub-sampling layers (e.g., second 106 and fourth 110 layers). In other implementations, the convolution and sub-sampling layers are in non-alternating order. For example, one implementation includes multiple consecutive convolution layers. Another implementation includes multiple consecutive sub-sampling layers.

Sub-sampling reduces the complexity and spatial resolution of the image data, which reduces the sensitivity of the output to variation. Sub-sampling also reduces the size of the features by some factor. In one example, the reduction in feature size is accomplished by summing a group of M×M elements of the output of the previous convolution layer. In another example, the reduction in feature size is accomplished by averaging a group of M×M elements, and multiplying the average by a constant.

In some descriptions of CNNs, the sub-sampling is described as pooling. There are a number of methods for pooling. One method for pooling is determining a sum of M×M elements. Another method of pooling is determining a maximum of M×M elements. In other implementations, a subsampling region can be overlapping with other subsampling regions. For example, in a 4×4 grid of numbers (which may be the output of a layer), using non-overlapping 2×2 regions for pooling results in a 2×2 output. In another example, in a 4×4 grid of numbers, using overlapping 2×2 regions for pooling results in a 3×3 output.

Nonlinearity

According to various implementations, CNN structures can have data passed through a nonlinear function after the convolution sum, after the sub-sampling or pooling, or after both the convolution sum and the sub-sampling for each layer. Three symmetric functions that can be used to process the CNN data include: the erfc(-x)-1 transfer function, the sigmoid function, and the Tanh functions, respectively. Additionally, the CNN data may be processed by a non-symmetric ReLU function, which is analogous to a rectifying function. In some implementations, the individual sums from a sub-sampling layer are passed through a squashing function before going to the next convolution layer. The squashing function can have a variety of shapes, and the shape of the squashing function can be symmetric or non-symmetric.

Features

In the CNN diagram shown in FIG. 1, the first layer 104 (a convolution layer) and the second layer 106 (a subsampling layer) have the same number of features. In particular, in FIG. 1, the first 104 and second 106 layers each have six features. The third layer 108 (a second convolution layer) has 16 features. The number of features is increased by adding several other mappings of the image pixels of the second layer 106 features to the features of the third layer 108. Thus, the number of features of the convolution and subsampling layers can differ. The expansion of the number of features illustrates a break of symmetry in the network. Additionally, convolution and subsampling layers can have different features. In particular, features can be transformed as the feature data moves from one layer to the next layer. According to some examples, the weights are determined during a training phase and the weights are saved after the training phase ends. In some examples, different features are maintained in a convolution layer from the features maintained in a subsampling layer.

Convolution Full Implementation

In the convolution layer, the sum from a previous subsampling layer is multiplied by a trainable weight. Additionally, a trainable bias is added.

In a convolution full implementation, every weight of a layer exists in the device circuit. For example, referring to FIG. 1, a convolution full implementation includes independent programmable weights for the six features of the first layer 104 and individual weights for each element of the convolution sum (shown in Equation 1 above). This is 25 weights for each sum. In one example, there are 28×28=784 convolutions for each of the six features of the first layer 104, resulting in 784 subwindows in the output array from the convolution operation 120 for each of the six features. Thus, the total number of convolutions in the first layer 104 is 6*28*28=4,704, and since there are 25 weights for each convolution, this results in 5*4,704=117,600 weighted sums.

In some implementations, the weights are tied such that the weights in each shifted window have the same value. When implementing a CNN with SAT, there is a separate CapDAC (capacitor digital-to-analog converter) for each weighted sum. In one example, when the weights are tied, the CapDACs are tied, and the tied CapDACs are programmed in a single operation. Thus, all the weights that are the same can be programmed in a single operation, rather than programming each of the weights separately. This helps improve efficiency of programming of the weights for the CNN.

One method used for reducing the number of weighted sums is increasing the stride of the subwindows. Increasing the stride of the subwindows means moving the subwindows by more than one pixel for each subwindow. For example, for a stride of two, the subwindow is moved two pixels horizontally and two pixels vertically, so the number of subwindows is reduced by four and there are four times fewer total weighted sums.

In one implementation, a full convolution implementation as described above has 117,600 weighted sums and therefore has 117,600 analog memory capacitors that connect to 117,600 digital to analog converters (DACs) that are the weights. In one example, the DACs are hybrid CapDACs. This implementation is fast since all of the convolution sums happen in parallel within a few clock cycles needed for the scaling by the weights. This implementation is also the largest in device area. For larger image data arrays, the full implementation method can be size and cost prohibitive.

Convolution Multiplexed Implementation

For imaging data at a selected frame rate, multiple convolution and sub-sampling layers can be pipelined, and each layer can operate independently in parallel. Each layer completes within the frame rate period. The boundaries for multiplexing can be implemented in a number of ways.

Figure 2:
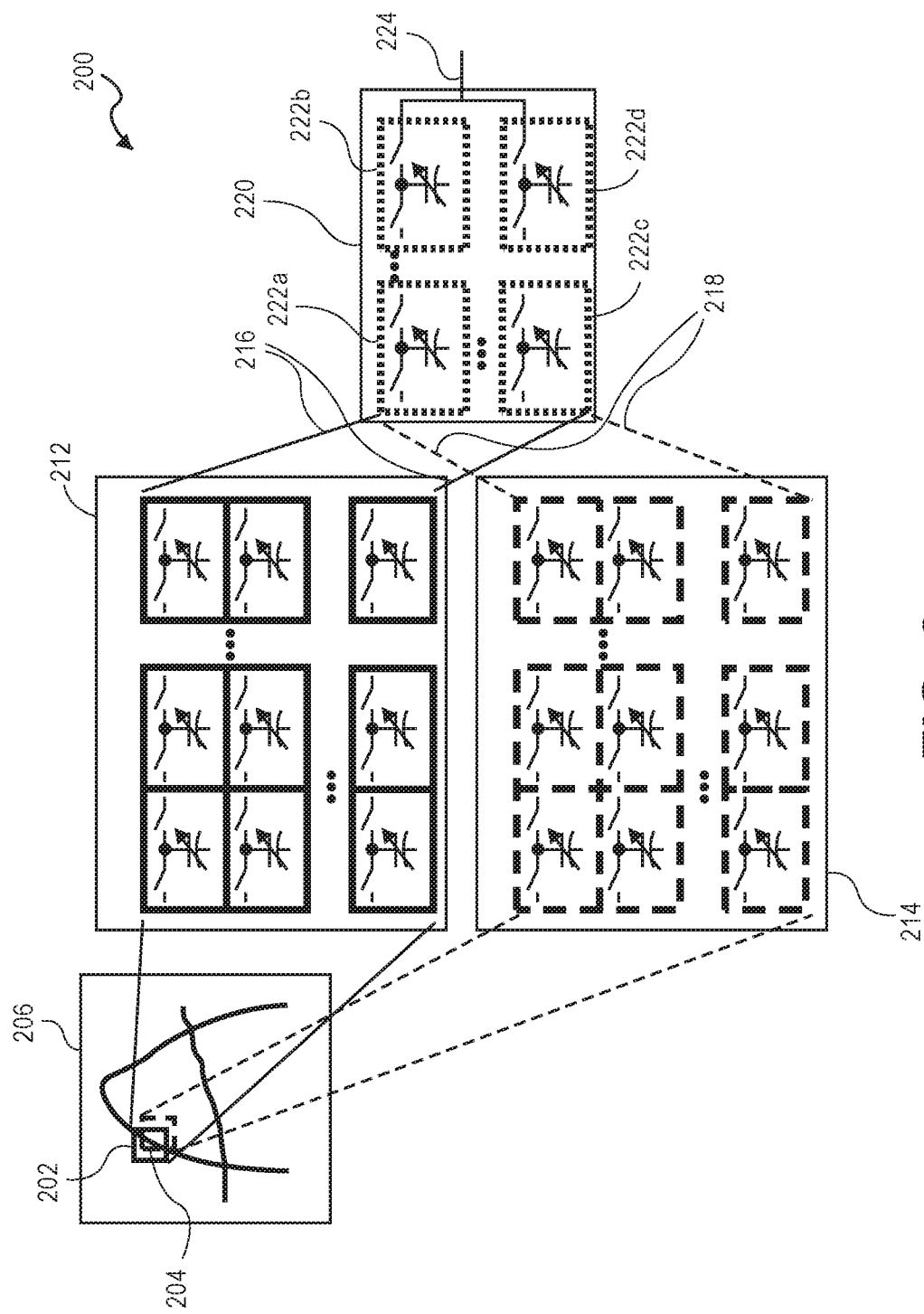
FIG. 2 is a diagram illustrating a convolution multiplexed circuit implementation, according to some embodiments of the disclosure.

FIG. 2 shows a convolution multiplexed circuit 200, according to some embodiments of the disclosure. In the circuit 200, each pixel has a set of capacitors connected to, or driven by, the image source. A first pixel 202 is coupled to a first set of capacitors 212, and a second pixel 204 is coupled a second set of capacitors 214. In one example, the first 212 and second 214 sets of capacitors are each a 5×5 subwindow of memory cells. In some examples, as shown in FIG. 2, a 5×5 subwindow scan of the image pixels is used, and there are 5 memory cells connected to each pixel source. In one example, the memory cells are analog memory cells.

In FIG. 2, the memory cells are fixed capacitors as shown in the first 212 and second 214 sets of capacitors. The first 212 and second 214 sets of capacitors are multiplexed (216, 218) to an array of variable capacitance structures 222a-222d. The variable capacitance structures 222a-222d can be in a number of forms. In one example, the variable capacitance structures 222a-222d are hybridCapDAC structure 220. The hybridCapDAC structure 220 outputs a convolution output 224.

In one example, the variable capacitance structures 222a-222d of FIG. 2 form a single 5×5 matrix subwindow. In other implementations, any number of arrays or matrices of variable capacitance cells can be multiplexed to reduce the convolution time.

Figure 3:
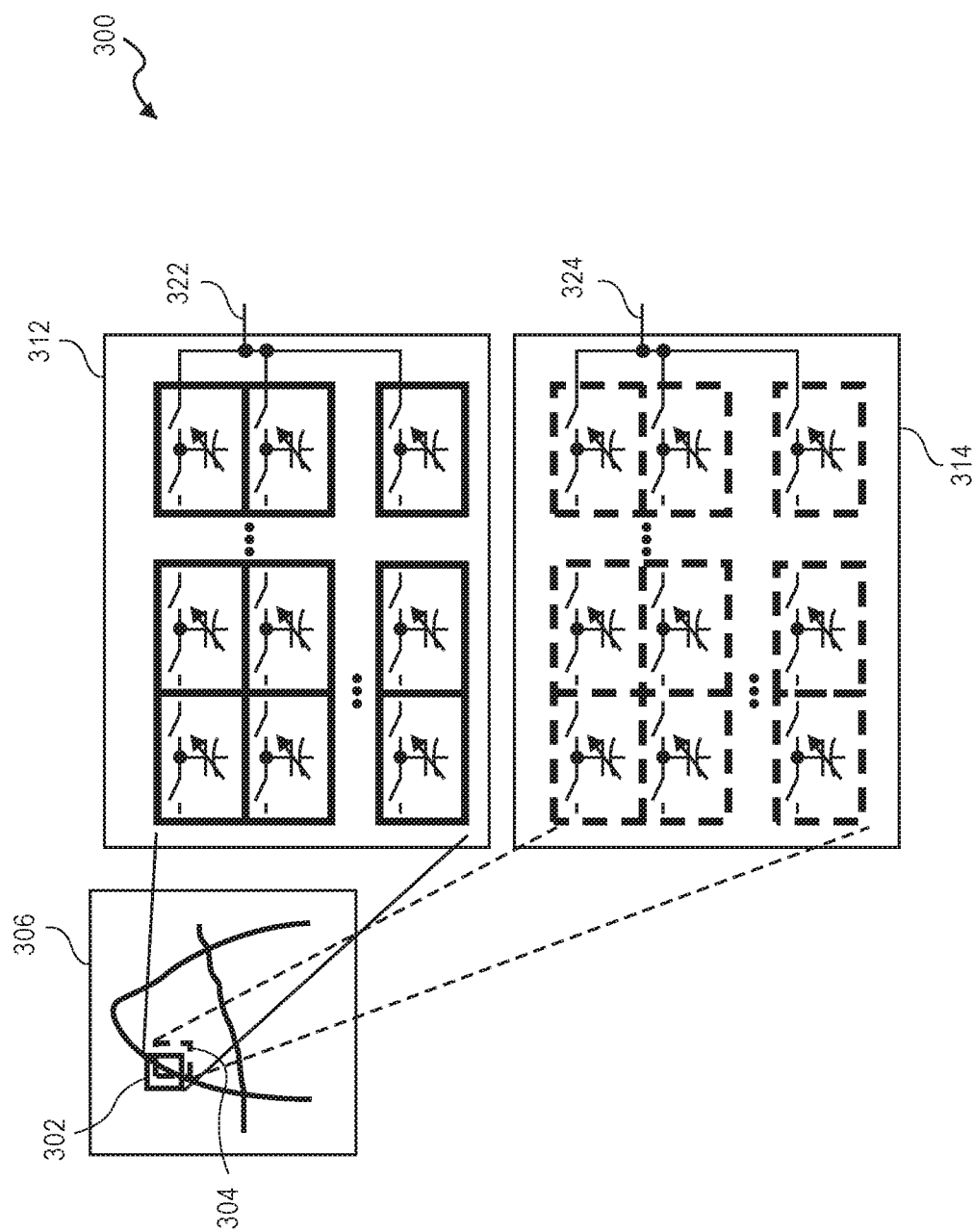
FIG. 3 is a diagram illustrating another convolution multiplexed circuit implementation, according to some embodiments of the disclosure.

FIG. 3 shows a convolution multiplexed circuit 300 that uses a variable capacitance cell directly, according to some embodiments of the disclosure. In the circuit 300, each pixel has a set of variable capacitors coupled to the image source. A first pixel 302 is coupled to a first set of variable capacitors 312, and a second pixel 304 is coupled a second set of variable capacitors 314. In one example, the first 312 and second 314 sets of capacitors are each a 5×5 subwindow of weighted memory cells. In some implementations, the memory cells have programmable weights. In some implementations, the weights for each of the memory cells are fixed after the learning phase of the neural network, in which the weights are learned. Thus, the weighting can be incorporated directly as a memory capacitor size that is equal to the weight. The first set of capacitors 312 has a first subwindow convolution output 322, and the second set of capacitors 314 has a second subwindow convolution output 324.

According to various implementations, the architecture shown in FIG. 3 is affected by the weight resolution requirements, such that when the weight resolution requirement is high, then the variable capacitor structure may be too large to implement as arrays. However, multiplexing as shown in FIG. 2 can be smaller and can be implemented as arrays even with high weight resolution requirements.

Bias Addition

Figure 4:
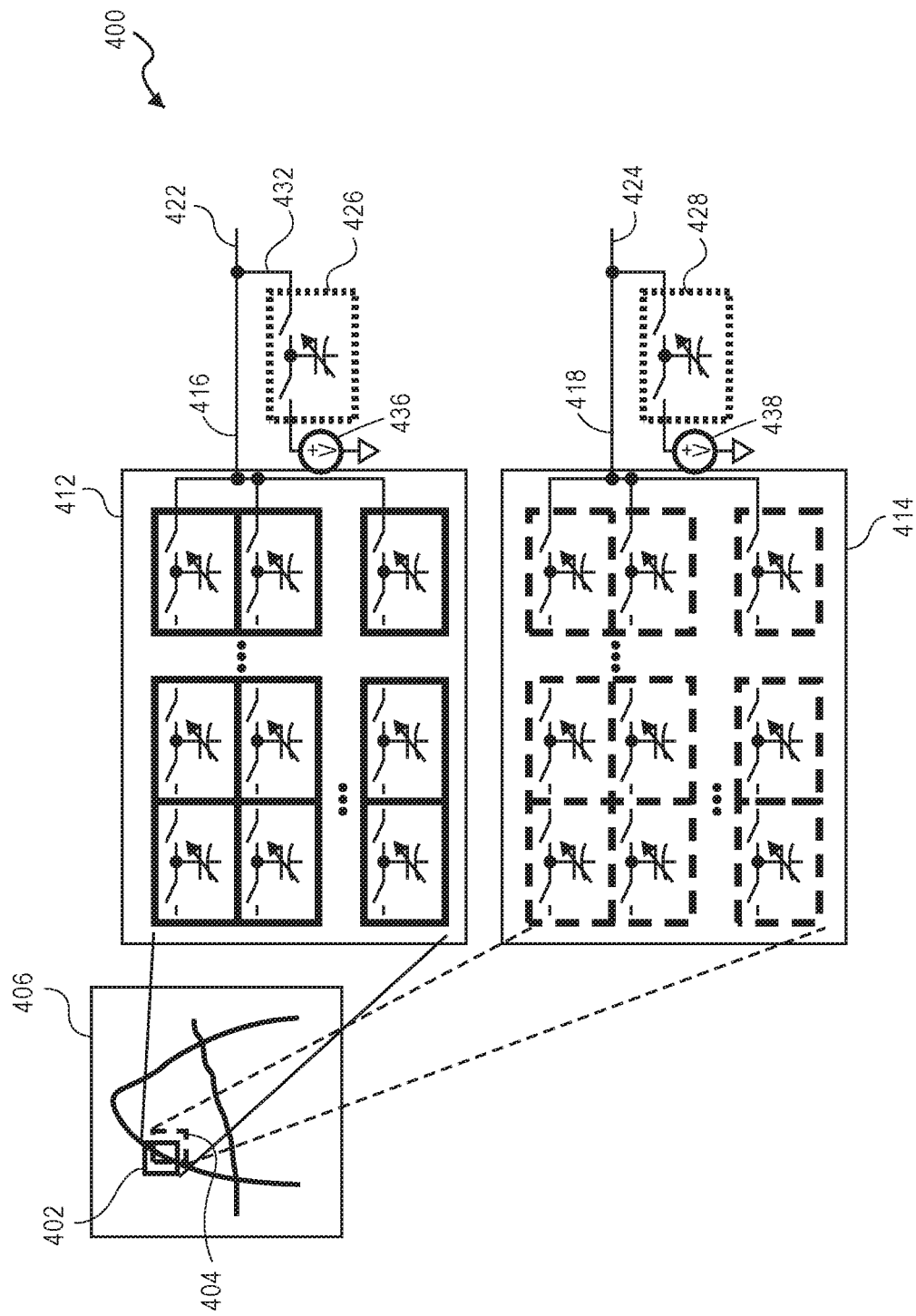
FIG. 4 is a diagram illustrating a convolution circuit, according to some embodiments of the disclosure.

In some implementations, the convolution sum of weighted values is shifted with a trainable bias value. FIG. 4 shows a diagram of a convolution circuit 400 including a weighted bias, according to some embodiments of the disclosure. In the circuit 400, each pixel has a set of variable capacitors coupled to the image source, similar to the circuit 300 shown in FIG. 3. A first pixel 402 is coupled to a first set of variable capacitors 412, and a second pixel 404 is coupled a second set of variable capacitors 414. In one example, the first 412 and second 414 sets of capacitors are each a 5×5 subwindow of weighted memory cells. The first set of capacitors 412 has a first output 416, and a first weighted bias 432 is added to the first output to result in the first subwindow convolution output 422. The second set of capacitors 414 has a second output 418, and a second weighted bias 434 is added to the second output 418 to result in the second subwindow convolution output 424. A first 432 and second 434 weighted biases shift the convolution sum of weighted values.

The first weighted bias 432 is added with a scaled charge value from a fixed voltage source 436 sampled by a CapDAC structure 426. Similarly, the second weighted bias 434 is added with a scaled charge value from a fixed voltage source 438 sampled by a CapDAC structure 428. In various examples, the CapDAC structures 426, 428 are HybridCapDACs.

Subsampling Layer Implementation

The subsampling layer involves an M×M average of the convolution outputs followed by a nonlinear transform. According to one implementation, the M×M average is an average of the non-overlapping M×M subwindows of the convolution outputs. The M×M average essentially decimates the spatial array output of the convolution step. However, charge sharing of an M×M subset of capacitor outputs of the convolution layer can act as a mean function directly. In some examples, there may be normalization issues when sharing of an M×M subset of capacitor outputs of the convolution layer acts directly as a mean function.

Figure 5:
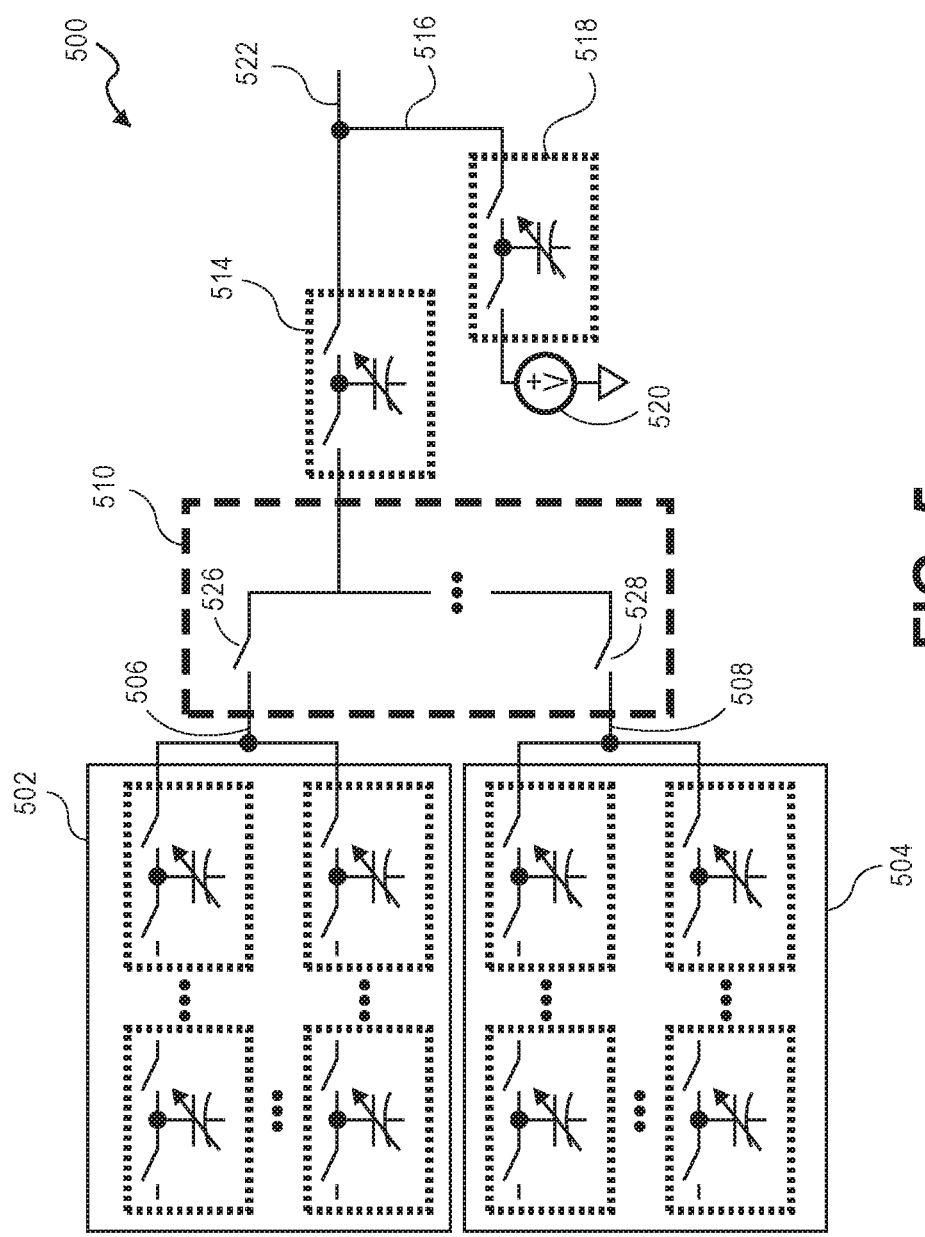
FIG. 5 is a diagram illustrating a non-overlapping sub-sampling, according to some embodiments of the disclosure.

In some implementations, subsampling is overlapping. In other implementations, subsampling is not overlapping. FIG. 5 shows a convolution multiplexed circuit 500 in which subsampling is non-overlapping, according to some embodiments of the disclosure. The circuit 500 includes a first subwindow of variable capDACs 502, and a second subwindow of variable capDACs 504. The capDACs in the first 502 and second 504 subwindows may be hybridCapDACs. The first subwindow 502 outputs a first convolution output 506, and the second subwindow 504 outputs a second convolution output 508. The first 506 and second 508 outputs are input to a subsampling summer 510 including a switching element. The subsampling summer 510 includes a first switch 526 coupled to the first output 506, and a second switch 528 coupled to the second output 508. In one implementation, the first 526 and second 528 switches prevent overlapping of the subsampling.

The subsampling output 512 from the subsampling switching element 510 is input to a variable capDAC 514. The variable capDAC 514 acts as a trainable weight. In some examples, the variable capDAC 514 is a hybridCapDAC. A bias 516 is added to the output from the variable capDAC 514 to result in the subwindow subsampling output 522. The bias 516 is added with a scaled charge value from a fixed voltage source 520 sampled by a CapDAC structure 518.

When subsampling is not overlapping subwindows, then the implementation is simple and passive. When overlapping is used, each output of the convolution sum drives several inputs of the subsequent subsampling layer.

Maximum Pooling Implementation

According to one implementation, another subsampling method is called MAX Pooling. MAX Pooling uses the maximum value of an M×M subwindow of values for the output. Implementing a MAX function in a switched capacitor (switchcap) circuit implies a comparison event among all of the M×M elements.

Figure 6:
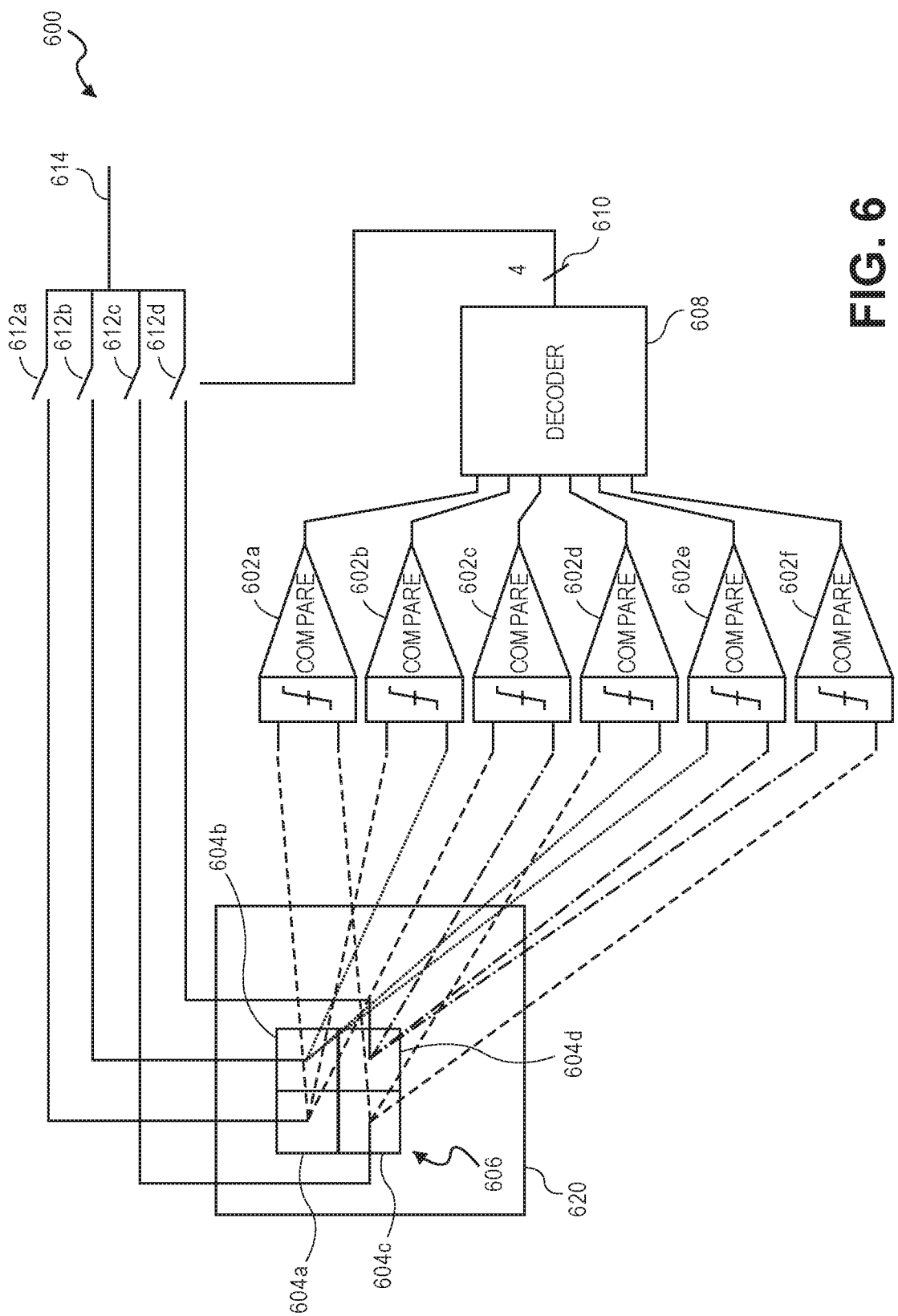
FIG. 6 is a diagram illustrating circuit for sub-sampling, according to some embodiments of the disclosure.

FIG. 6 shows a circuit 600 for sub-sampling, and in particular for MAX pooling, according to some embodiments of the disclosure. The MAX pooling circuit 600 includes a set of six analog voltage comparators 602a-602f for comparing four elements 604a-604d of a 2×2 subwindow 606 of a window 620 with the other elements 604a-604d in the subwindow 606. As shown in FIG. 6, the first element 604a is compared with the second element 604b at comparator 602b, the first element 604a is compared with the third element 604c at comparator 602a, and the first element 604a is compared with the fourth element 604d at comparator 602c. Similarly, the second element 604b is compared with the first 604a, third 604c, and fourth 604d elements, at comparators 602b, 602d, and 602e, respectively. The third element 604c is compared with the first 604a, second 604b, and fourth 604d elements, at comparators 602a, 602d, and 602f, respectively. The fourth element 604d is compared with the first 604a, second 604b, and third 604c elements at comparators 602c, 602e, and 6021, respectively. In various implementations, the analog voltage comparators can be continuous time comparators or clocked comparators.

The outputs of the comparators 602a-602f are decoded at a decoder 608 to determine the largest element. In one example, the decoder 608 is a combinatorial logic block. The decoder 608 outputs a digital decision 610 that selects which of four switches 612a-612d to close to enable the MAX operation output, where the switches 612a-612d connect lines from each of the subwindows 604a-604d to the output line 614. When a switch is closed, data from the respective subwindow will be output to the output line 614.

Nonlinear Function Implementation

As discussed above, various different transfer functions can be used in the subsampling layers of a CNN. When a nonlinear transfer function is used in the subsampling layers of a CNN, the shape of the nonlinear transfer function has a broad range of possibilities. According to one aspect, implementing the CNN layers with SAT includes picking a nonlinear transfer function that is small and low power. According to various implementations, an analog rectification function is used for the subsampling layers of a CNN, and the rectification is either greater than zero or less than zero. In particular, the analog rectifcation is a constant offset in input and output from the ideal function. The trainable bias terms can compensate for the constant offset.

Figure 7:
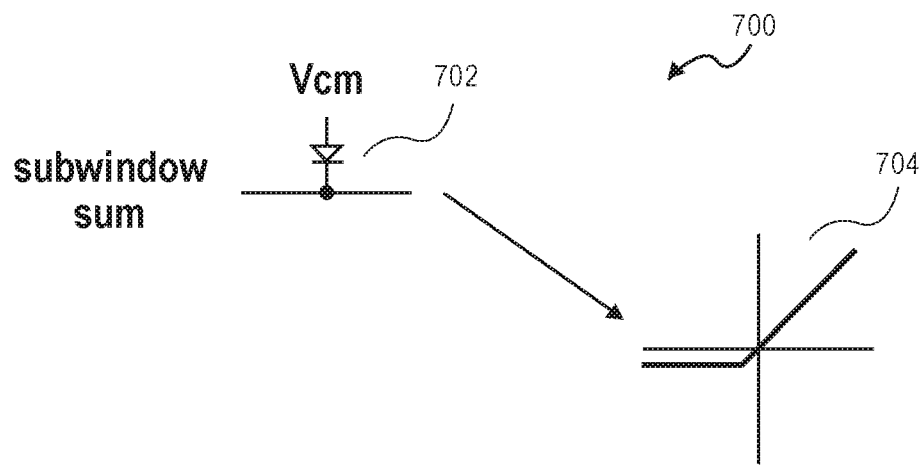
FIG. 7 is a diagram illustrating a nonsymmetric transform, according to some embodiments of the disclosure.
Figure 8:
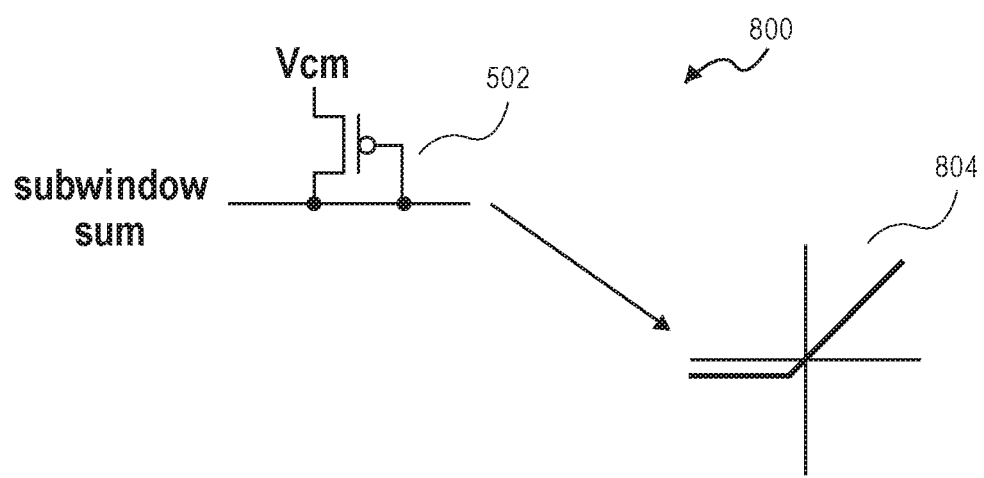
FIG. 8 is a diagram illustrating another nonsymmetric transform, according to some embodiments of the disclosure.
Figure 9:
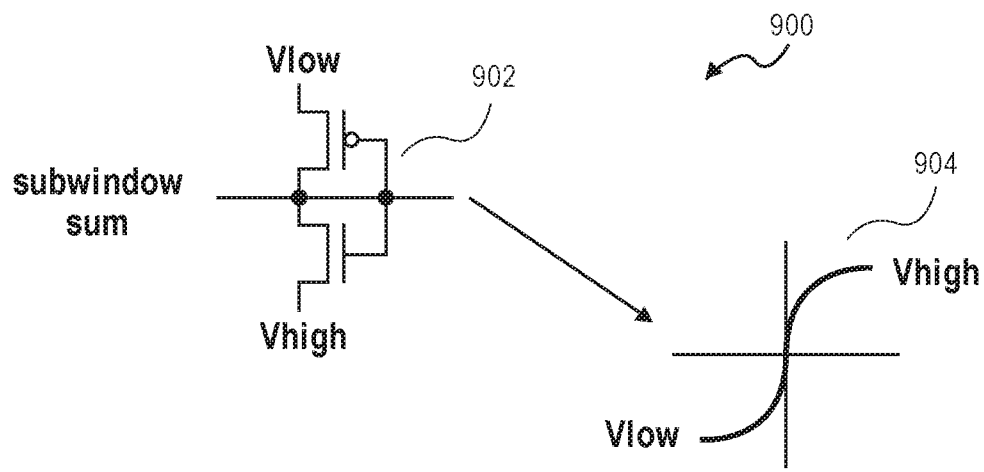
FIG. 9 is a diagram illustrating a symmetric nonlinear transform, according to some embodiments of the disclosure.

FIGS. 7, 8, and 9 show three ways of creating nonlinear transforms. FIG. 7 shows a nonsymmetric transform 700 including a diode rectification circuit 702, according to some embodiments of the disclosure. The nonsymmetric transform 700 results in a rectification transfer function 704. FIG. 8 shows a nonsymmetric transform 800 including MOSFET rectification 802, according to some embodiments of the disclosure. The nonsymmetric transform 800 results in a rectification transfer function 804. FIG. 9 shows a symmetric nonlinear transform 900 including MOSFET clamping 902. The symmetric nonlinear transform 900 results in a transfer function 904.

FIGS. 7, 8, and 9 include shunting elements, which connect to capacitance based charge outputs. One example of a capacitance based charge output is a subwindow sum output that is passed through the transform. The transforms 700, 800, and 900 can be used to change the charge on a subsampling layer output by implementing a charge sharing (CS) event.

According to various implementations, the process, temperature and voltage variability can be adjusted. In various examples, detection success can be sensitive to variability in process, temperature and voltage.

Figure 10:
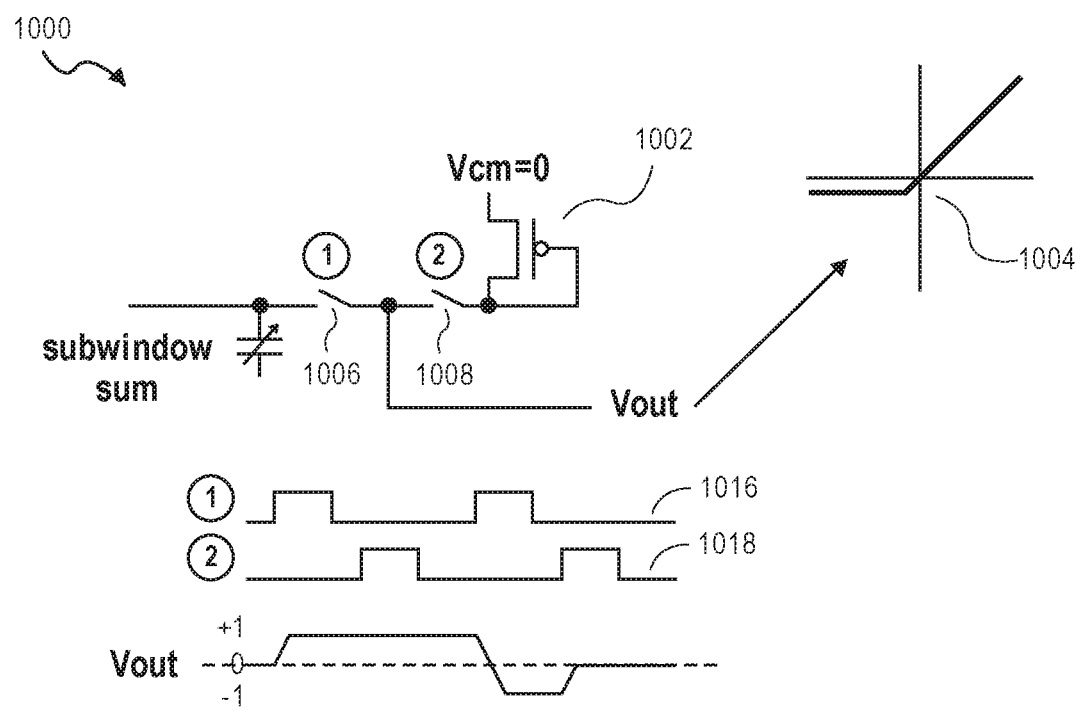
FIG. 10 is a diagram illustrating a nonsymmetric transform, according to some embodiments of the disclosure.

FIG. 10 shows a nonsymmetric transform 1000 including MOSFET rectification 1002 and first 1006 and second 1008 switches. The first 1006 and second 1008 switches close according to the first 1016 and second 1018 timing diagrams, respectively. FIG. 10 shows an implementation of rectification using a charge sharing event to discharge the charge on the subwindow sum during clock phase 2 when the voltage is negative. Other functions can be implemented in a similar way. The nonsymmetric transform 1000 results in a rectification transfer function 1004.

In some implementations, the nonlinear transfer function or squashing function is implemented at the convolution operation as well as at the output of the pooling operation.

Applications

Convolutional neural networks (CNNs) use spatial and temporal structure by sharing weights across features. The architecture of CNNs allow for equivariance in the feature activations, thus making CNNs ideal for image and video applications. For example, character identification such as hand written digit recognition and, more broadly, image recognition/classification, and video recognition/classification. According to various implementations, CNNs are used when the input data is in the form of an array with highly correlated local variables and have shift invariance.

Speech and Natural language processing are two other areas in which CNNs can be used to take advantage of the inherent structure in the problem. Automatic Speech Recognition (ASR) is one application that has historically been approached by using Hidden Markov Models (HMMs) or Gaussian Mixture Models (GMMs) to solve the problem. Now, however, the state of the art is to use deep neural networks and in particular CNNs for ASR. CNNs that have been trained to do ASR can also be used to identify languages in noisy environments.

CNNs have very broad reaching applications including drug discovery and chemical analysis. In one application, a CNN is trained to predict bioactivity and chemical interactions of molecules. Biological systems operate via molecular level interactions, thus being able to predict molecular interactions using CNNs can greatly aid in drug discovery.

In other applications, CNNs can be used for DNA Mapping. DNA mapping is used to describe the positions of genes on chromosomes, and to determine the distance between genes.

Figure 11:
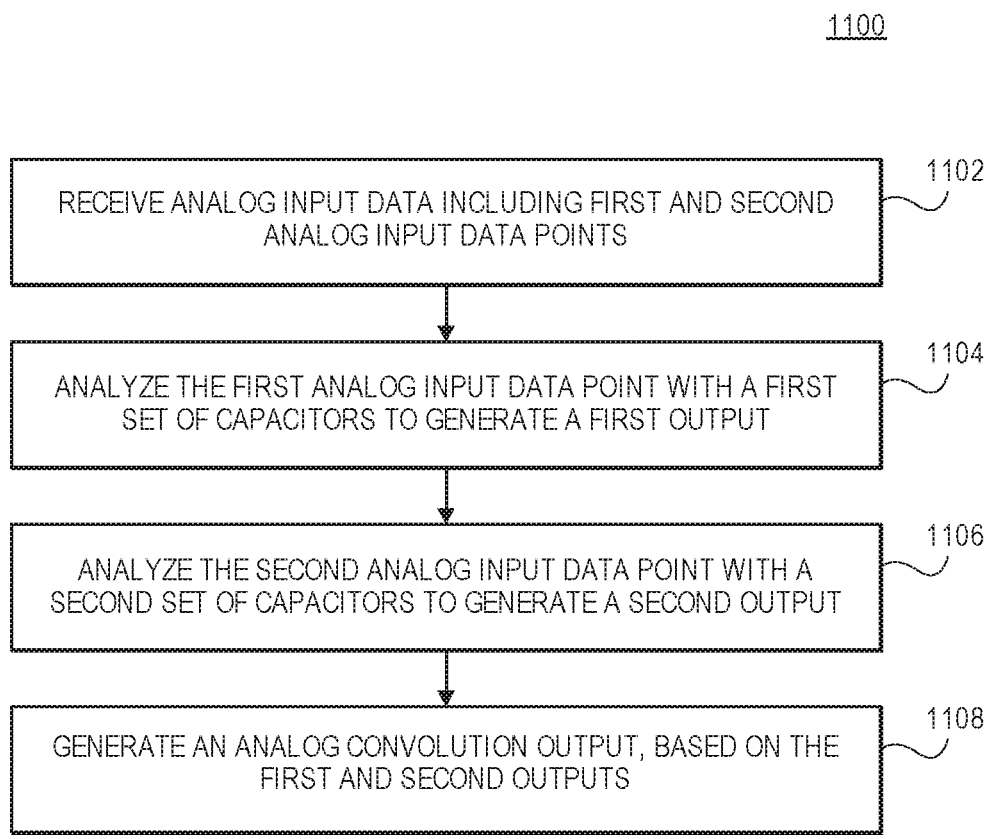
FIG. 11 is a flowchart illustrating a method for implementing a neural network using sampled analog technology, according to some embodiments of the disclosure.

FIG. 11 shows a method 1100 for implementing a neural network using sampled analog technology, according to some embodiments of the disclosure. At step 1102, analog input data including first and second analog input data points is received. At step 1104, the first analog input data point is analyzed with a first set of capacitors to generate a first output. At step 1106, the second analog input data point is analyzed with a second set of capacitors to generate a second output. At step 1108, an analog convolution output is generated based on the first and second outputs. The analog convolution output includes a plurality of features, as discussed above.

In some examples, the method includes multiplexing the first and second outputs through an array of variable capacitance structures to generate the analog convolution output. In some implementations, the first and second sets of capacitors are variable capacitance cells, and the first and second sets of capacitors each have a fixed weight. Generating the first output includes multiplying the first input data point with the first fixed weight, and generating the second output includes multiplying the second input data point with the second fixed weight.

In some implementations, a first bias value is generated by sampling a scaled charge from a first fixed voltage source, and adding the first bias value to the first output. The scaled charge is sampled by a first capacitor digital-to-analog converter. In some examples, the analog convolution output is averaged with a second analog convolution output at a sub-sampler. In some examples, the analog convolution output includes a subwindow of values, and a maximum value of the subwindow of values is determined.

Variations and Implementations

In various implementations, SAT as described herein can be used in any type of CNN. According to some implementations, SAT is used in Dense Convolutional Networks. In Dense Convolutional Neural Networks, each layer is connected with every other layer in a feed-forward manner. For each layer, the inputs include features of all the preceding layers. Similarly, for each layer, the layer's features are input to all subsequent layers.

In the discussions of the embodiments above, the capacitors, clocks, DFFs, dividers, inductors, resistors, amplifiers, switches, digital core, transistors, and/or other components can readily be replaced, substituted, or otherwise modified in order to accommodate particular circuitry needs. Moreover, it should be noted that the use of complementary electronic devices, hardware, software, etc. offer an equally viable option for implementing the teachings of the present disclosure.

In one example embodiment, any number of electrical circuits of the figures may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of digital signal processors, microprocessors, supporting chipsets, etc.), computer-readable non-transitory memory elements, etc. can be suitably coupled to the board based on particular configuration needs, processing demands, computer designs, etc. Other components such as external storage, additional sensors, controllers for audio/video display, and peripheral devices may be attached to the board as plug-in cards, via cables, or integrated into the board itself. In various embodiments, the functionalities described herein may be implemented in emulation form as software or firmware running within one or more configurable (e.g., programmable) elements arranged in a structure that supports these functions. The software or firmware providing the emulation may be provided on non-transitory computer-readable storage medium comprising instructions to allow a processor to carry out those functionalities.

In another example embodiment, the electrical circuits of the figures may be implemented as stand-alone modules (e.g., a device with associated components and circuitry configured to perform a specific application or function) or implemented as plug-in modules into application specific hardware of electronic devices. Note that particular embodiments of the present disclosure may be readily included in a system on chip (SOC) package, either in part, or in whole. An SOC represents an IC that integrates components of a computer or other electronic system into a single chip. It may contain digital, analog, mixed-signal, and often radio frequency functions: all of which may be provided on a single chip substrate. Other embodiments may include a multi-chip-module (MCM), with a plurality of separate ICs located within a single electronic package and configured to interact closely with each other through the electronic package. In various other embodiments, the CNN functionalities may be implemented in one or more silicon cores in Application Specific Integrated Circuits (ASICs), Field Programmable Gate Arrays (FPGAs), and other semiconductor chips.

In another example embodiment, the electrical circuits of the figures may be implemented to be part of the training of the CNN circuit. The training is a feedback path which processes the output of the CNN block to determine the various weights.

It is also imperative to note that all of the specifications, dimensions, and relationships outlined herein (e.g., the number of processors, logic operations, etc.) have only been offered for purposes of example and teaching only. Such information may be varied considerably without departing from the spirit of the present disclosure, or the scope of the appended claims. The specifications apply only to one non-limiting example and, accordingly, they should be construed as such. In the foregoing description, example embodiments have been described with reference to particular processor and/or component arrangements. Various modifications and changes may be made to such embodiments without departing from the scope of the appended claims. The description and drawings are, accordingly, to be regarded in an illustrative rather than in a restrictive sense.

Note that the activities discussed above with reference to the figures are applicable to any integrated circuits that involve signal processing, particularly those that can execute specialized software programs, or algorithms, some of which may be associated with processing digitized real-time data. Certain embodiments can relate to multi-DSP signal processing, floating point processing, signal/control processing, fixed-function processing, microcontroller applications, etc.

In certain contexts, the features discussed herein can be applicable to medical systems, scientific instrumentation, wireless and wired communications, radar, industrial process control, audio and video equipment, current sensing, instrumentation (which can be highly precise), and other digital-processing-based systems.

Moreover, certain embodiments discussed above can be provisioned in digital signal processing technologies for medical imaging, patient monitoring, medical instrumentation, and home healthcare. This could include pulmonary monitors, accelerometers, heart rate monitors, pacemakers, etc. Other applications can involve automotive technologies for safety systems (e.g., stability control systems, driver assistance systems, braking systems, infotainment and interior applications of any kind). Furthermore, powertrain systems (for example, in hybrid and electric vehicles) can use high-precision data conversion products in battery monitoring, control systems, reporting controls, maintenance activities, etc.

In yet other example scenarios, the teachings of the present disclosure can be applicable in the industrial markets that include process control systems that help drive productivity, energy efficiency, and reliability. In consumer applications, the teachings of the signal processing circuits discussed above can be used for image processing, auto focus, and image stabilization (e.g., for digital still cameras, camcorders, etc.). Other consumer applications can include audio and video processors for home theater systems, DVD recorders, and high-definition televisions. Yet other consumer applications can involve advanced touch screen controllers (e.g., for any type of portable media device). Hence, such technologies could readily part of smartphones, tablets, security systems, PCs, gaming technologies, virtual reality, simulation training, etc.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, and elements of the figures may be combined in various possible configurations, all of which are clearly within the broad scope of this Specification. In certain cases, it may be easier to describe one or more of the functionalities of a given set of flows by only referencing a limited number of electrical elements. It should be appreciated that the electrical circuits of the figures and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Note that in this Specification, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments.

It is also important to note that the functions related to CNNs illustrate only some of the possible CNN functions that may be executed by, or within, systems illustrated in the Figures. Some of these operations may be deleted or removed where appropriate, or these operations may be modified or changed considerably without departing from the scope of the present disclosure. In addition, the timing of these operations may be altered considerably. The preceding operational flows have been offered for purposes of example and discussion. Substantial flexibility is provided by embodiments described herein in that any suitable arrangements, chronologies, configurations, and timing mechanisms may be provided without departing from the teachings of the present disclosure.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. In order to assist the United States Patent and Trademark Office (USPTO) and, additionally, any readers of any patent issued on this application in interpreting the claims appended hereto, Applicant wishes to note that the Applicant: (a) does not intend any of the appended claims to invoke paragraph six (6) of 35 U.S.C. section 112 as it exists on the date of the filing hereof unless the words "means for" or "step for" are specifically used in the particular claims; and (b) does not intend, by any statement in the specification, to limit this disclosure in any way that is not otherwise reflected in the appended claims.

OTHER NOTES, EXAMPLES, AND IMPLEMENTATIONS

Note that all optional features of the apparatus described above may also be implemented with respect to the method or process described herein and specifics in the examples may be used anywhere in one or more embodiments.

In a first example, a system is provided (that can include any suitable circuitry, dividers, capacitors, resistors, inductors, ADCs, DFFs, logic gates, software, hardware, links, etc.) that can be part of any type of computer, which can further include a circuit board coupled to a plurality of electronic components. The system can include means for clocking data from the digital core onto a first data output of a macro using a first clock, the first clock being a macro clock; means for clocking the data from the first data output of the macro into the physical interface using a second clock, the second clock being a physical interface clock; means for clocking a first reset signal from the digital core onto a reset output of the macro using the macro clock, the first reset signal output used as a second reset signal; means for sampling the second reset signal using a third clock, which provides a clock rate greater than the rate of the second clock, to generate a sampled reset signal; and means for resetting the second clock to a predetermined state in the physical interface in response to a transition of the sampled reset signal.

The 'means for' in these instances (above) can include (but is not limited to) using any suitable component discussed herein, along with any suitable software, circuitry, hub, computer code, logic, algorithms, hardware, controller, interface, link, bus, communication pathway, etc. In a second example, the system includes memory that further comprises machine-readable instructions that when executed cause the system to perform any of the activities discussed above.

What is claimed is:

1. A convolutional neural network using sampled analog technology, comprising:
   an input source including first and second analog input data points,
   a first set of capacitors coupled to the first analog input data point and configured to passively combine the first analog input data with first weights and output a first analog convolution output, wherein first weights are stored as first capacitances on each of the first set of capacitors,
   a sub-sampler coupled to the first analog convolution output, wherein the first analog convolution output includes a subwindow of values, and wherein the sub-sampler includes a plurality of analog voltage comparators for determining a maximum value of the subwindow of values of the first analog convolution output, and
   a second set of capacitors coupled to the second analog input data point and configured to passively combine the second analog input data with second weights and output a second analog convolution output, wherein second weights are stored as second capacitances on each of the second set of capacitors,
   wherein the first and second analog convolution outputs each include a plurality of features.

2. The convolutional neural network of claim 1, further comprising an array of variable capacitance structures, wherein the first and second outputs are multiplexed through the array of variable capacitance structures to generate a multiplexed convolution output.

3. The convolutional neural network of claim 1, wherein the first and second sets of capacitors comprise fixed capacitors, and wherein the fixed capacitors are analog memory cells.

4. The convolutional neural network of claim 1, wherein the first and second sets of capacitors are variable capacitance cells, and wherein the first and second weights are fixed weights.

5. The convolutional neural network of claim 4, wherein the fixed weights are implemented using a memory capacitor size, and wherein the memory capacitor size is equal to a weight of the fixed weights.

6. The convolutional neural network of claim 1, wherein the first set of capacitors and the second set of capacitors receive charge from the input source.

7. The convolutional neural network of claim 1, further comprising:
   a first fixed voltage source having a charge, and
   a first capacitor digital-to-analog converter (capDAC),
   wherein the charge from the first fixed voltage source is sampled by the first capDAC to generate a first bias value, and
   wherein the first bias value is added to the first output.

8. The convolutional neural network of claim 1, further comprising a sub-sampler coupled to the first and second analog convolution outputs, wherein the sub-sampler averages the first and second analog convolution outputs to generate a mean convolution output, and wherein the sub-sampler processes the mean convolution output with a nonlinear transfer function.

9. The convolutional neural network of claim 8, wherein the nonlinear transfer function is an analog rectification function.

10. A method for implementing a neural network using sampled analog technology, comprising:
    receiving analog input data including first and second analog input data points,
    sampling the first analog input data point with a first set of capacitors,
    generating a first analog convolution output using first weights stored as first capacitances on each of the first set of capacitors, by passively combining the first analog input data with the first weights,
    sub-sampling the first analog convolution output, wherein the first analog convolution output includes a subwindow of values, and wherein sub-sampling includes determining a maximum value of the subwindow of values of the first analog convolution output at a plurality of analog voltage comparators;
    sampling the second analog input data point with a second set of capacitors, and
    generating a second analog convolution output using second weights stored as second capacitances on each of the second set of capacitors, by passively combining the second analog input data with the second weights,
    wherein generating the first and second analog convolution outputs includes performing an analog convolution operation on a plurality of features.

11. The method of claim 10, further comprising multiplexing the first and second analog convolution outputs through an array of variable capacitance structures to generate an analog multiplexed convolution output.

12. The method of claim 10, wherein the first and second sets of capacitors are variable capacitance cells, the first weight is a first fixed weight on the first set of capacitors, and the second weight is a second fixed weight on the second set of capacitors, and wherein
    generating the first analog convolution output includes multiplying the first input data point with the first fixed weight, and
    generating the second analog convolution output includes multiplying the second input data point with the second fixed weight.

13. The method of claim 10, further comprising:
    generating a first bias value by sampling, using a first capacitor digital-to-analog converter, a scaled charge from a first fixed voltage source, and
    adding the first bias value to the first output.

14. The method of claim 10, further comprising averaging the first analog convolution output with the second analog convolution output at a sub-sampler.

15. A convolutional neural network using sampled analog technology, comprising
    an input including analog input data,
    a plurality of sets of capacitors, each set of capacitors coupled to a respective subwindow of the analog input data and configured to passively combine the analog input data with weights stored as capacitances, and output an analog convolution output for the respective subwindow using the weights, wherein the analog convolution output includes a plurality of features, and
    an analog sub-sampler coupled to the analog convolution output, wherein the analog sub-sampler is configured to reduce a size of at least one of the plurality of features of the analog convolution output, wherein the analog convolution output includes a subwindow of values, and wherein the analog sub-sampler includes a plurality of analog voltage comparators for determining a maximum value of the subwindow of values of the analog convolution output.

16. The convolutional neural network of claim 15, wherein the plurality of sets of capacitors comprise fixed capacitors, and wherein the fixed capacitors are analog memory cells.

17. The convolutional neural network of claim 15, wherein the plurality of sets of capacitors comprise variable capacitance cells, and wherein the weights are fixed weights.

18. The convolutional neural network of claim 15, further comprising:
- a fixed voltage source having a charge, and
- a capacitor digital-to-analog converter (capDAC),
- wherein a charge from the fixed voltage source is sampled by the capDAC to generate a bias value, and
- wherein the bias value is added to an output from one of the plurality of sets of capacitors.

19. The convolutional neural network of claim 17, wherein the fixed weights are implemented using a memory capacitor size, and wherein the memory capacitor size is equal to a weight of the fixed weights.

20. The convolutional neural network of claim 15, wherein the plurality of sets of capacitors receive charge from the input.

\* \* \* \* \*